United States Patent
Shimazu et al.

(10) Patent No.: US 7,314,525 B2
(45) Date of Patent: Jan. 1, 2008

(54) PLASMA CVD APPARATUS

(75) Inventors: Tadashi Shimazu, Hyogo (JP); Masahiko Inoue, Hyogo (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 76 days.

(21) Appl. No.: 10/201,020

(22) Filed: Jul. 24, 2002

(65) Prior Publication Data

US 2003/0145788 A1 Aug. 7, 2003

(30) Foreign Application Priority Data

Feb. 1, 2002 (JP) ............... 2002-025606

(51) Int. Cl.
*C23C 16/00* (2006.01)
*C23C 14/00* (2006.01)

(52) U.S. Cl. .............. 118/712; 118/715; 204/298.02; 204/298.03; 204/298.07

(58) Field of Classification Search ............ 118/723 E, 118/723 ER, 723 I, 723 IR, 723 AN, 715, 118/712; 156/345.33, 345.34, 345.43, 345.47, 156/345.48, 345.49, 345.24, 345.26, 345.28; 427/569–579; 438/788; 204/298.02, 298.03, 204/298.07, 298.08

See application file for complete search history.

(56) References Cited

U.S. PATENT DOCUMENTS 5,494,522 A * 2/1996 Moriya et al. .............. 118/719
6,028,014 A 2/2000 Sukjarev
6,326,064 B1 12/2001 Denison et al.
6,566,186 B1 * 5/2003 Allman et al. .............. 438/239

FOREIGN PATENT DOCUMENTS

| EP | 1 035 568 | * | 9/2000 |
|---|---|---|---|
| EP | 1 302 561 | | 4/2003 |
| JP | 06-216047 | | 8/1994 |
| JP | 09-022940 | | 1/1997 |
| JP | 9-298241 | | 11/1997 |
| JP | 09-315811 | | 12/1997 |
| JP | 2000-306696 | * | 11/2000 |
| JP | 2001-267310 | | 9/2001 |
| KR | 2001-0034810 | | 4/2001 |
| WO | WO 99/27574 | * | 6/1999 |
| WO | WO99/54521 | | 10/1999 |

* cited by examiner

*Primary Examiner*—Luz Alejandro-Mulero
(74) *Attorney, Agent, or Firm*—Oblon, Spivak, McClelland, Maier & Neustadt, P.C.

(57) ABSTRACT

A plasma CVD apparatus comprises a reaction container for allowing a reaction for forming a thin film on a semiconductor wafer to be performed, a bias electrode which applies a high frequency bias for sputtering to the semiconductor wafer, a nozzle which supplies $SiH_4$ gas including at least hydrogen into the reaction container, and a control circuit which on/off-controls the high frequency bias through a switch and which on/off-controls the supply of $SiH_4$ gas through a flow rate controller based on an opposite control logic to a high frequency bias control logic.

4 Claims, 6 Drawing Sheets

VAPOR DEPOSITION ONLY (RF INPUT ONLY)

VAPOR DEPOSITION + SPUTTERING (RF INPUT + LF INPUT)

PLASMA CVD APPARATUS

FIELD OF THE INVENTION

The present invention relates to a plasma CVD apparatus which can suppress the deterioration of hydrogen reduction during film formation.

BACKGROUND OF THE INVENTION

A plasma CVD apparatus which forms a thin film such as an insulating film on a semiconductor wafer using plasma vapor phase excitation has been conventionally used in semiconductor device manufacturing process. This plasma CVD apparatus supplies material gas which consists of elements constituting a thin film onto the semiconductor wafer and forms a desired thin film by a vapor phase or a chemical reaction on the surface of the semiconductor wafer. Plasma discharge is used to excite gas molecules.

FIG. 4 shows the configuration of a conventional plasma CVD device. In FIG. 4, a reaction container 10 is a container which has an evacuated interior and which allows an insulating film to be formed on a semiconductor wafer 19 having a diameter of 12 inches. A nozzle 11 which emits Ar gas, a nozzle 12 which emits $O_2$ gas and a nozzle 13 which emits $SiH_4$ gas which serves as the material gas explained above are provided on the inner side face of the reaction container 10.

An RF electrode 14 is provided on the upper section of the reaction container 10 and connected to a high frequency power supply 15. This RF electrode 14 generates a high frequency electric field to deposit $SiO_X$ on the semiconductor wafer 19. As shown in FIG. 5A, during the vapor deposition, an insulating film 19b is formed to cover wirings 19a formed on the semiconductor wafer 19. At this moment, however, the insulating film 19b does not completely reach gaps between the wirings 19a. In FIG. 5A, an RF input is a high frequency input from the RF electrode 14. In addition, the RF power of the RF electrode 14 is set at, for example, 3 kW.

A support base 16 is provided in the reaction container 10 and supports the semiconductor wafer 19 by an electrostatic force. A bias electrode 17 is embedded in the support base 16 so as to be opposed to the RF electrode 14 and is connected to a high frequency power supply 18.

The bias electrode 17 applies a bias so as to draw ionized $Ar^+$ into the semiconductor wafer 19. The ionized $Ar^+$ etches the insulating film 19b deposited on the upper corner sections of the wirings 19a. In this instance, therefore, the upper sections of the gaps between the wirings 19a are always opened, making it possible to evaporate the insulating film 19b compactly into the gaps between the wirings 19a. In FIG. 5B, an LF input is a bias input from the bias electrode 17. The bias power of the bias electrode 17 is, for example, 1 kW.

According to the configuration explained above, the Ar gas, the $O_2$ gas and the $SiH_4$ gas are constantly emitted from the nozzles 11, 12 and 13 into the reaction container 10, respectively, as can be seen from "B", "C" and "E" shown in FIG. 6. Likewise, the high frequency power supplies 15 and 18 are constantly connected to the RF electrode 14 and the bias electrode 17, respectively. That is, as can be seen from "A" and "D" shown in FIG. 6, the RF electrode 14 and the bias electrode 17 are kept in an RF input (high frequency input) state and an LF input (bias input) state, respectively.

Therefore, vapor deposition due to the RF input and sputtering due to the LF input are simultaneously carried out in the reaction container 10.

In other words, as shown in FIG. 5B, the insulating film 19b which consists of $SiH_4$ is evaporated on the surface of the semiconductor wafer 19 and sputtering is carried out so that $Ar^+$ is drawn into the semiconductor wafer 19 side. As a result of this sputtering, the excess insulating film 19b is scraped off and the insulating film 19b spreads into the gaps between the wirings 19a.

The conventional plasma CVD apparatus draws $Ar^+$ into the semiconductor wafer 19 by applying a bias thereto from the bias electrode 17 shown in FIG. 4. However, when the bias is applied, hydrogen existing in the reaction container 10 is also drawn into the semiconductor wafer 19. FIG. 7A is a view which shows a relationship between the mass number of an element and current (drawn-in quantity) when bias is OFF. FIG. 7B is a view which shows a relationship between the mass number of an element and current (drawn-in quantity) when bias is ON. The mass number of an element=2 corresponds to that of hydrogen molecules ($H_2$).

The quantity of hydrogen which is drawn into the semiconductor wafer 19 rapidly increases when bias is OFF and ON. In this instance, deterioration due to reduction with hydrogen occurs in the semiconductor wafer 19, which adversely influences device characteristic. If the semiconductor wafer 19 is made of a ferroelectric material, in particular, the P(polarization)-V(applied voltage) characteristic of the semiconductor wafer 19 (semiconductor device) deteriorates as shown in FIG. 8. That is, before film formation, the P-V characteristic has an ordered before-film-formation hysteresis loop 30. After film formation, the P-V characteristic has a disordered after-film-formation hysteresis loop 31.

SUMMARY OF THE INVENTION

It is an object of the present invention to provide a plasma CVD apparatus which can suppress the deterioration of hydrogen reduction in a semiconductor wafer during film formation.

The plasma CVD apparatus according to this invention comprises a reaction container for allowing a reaction for forming a thin film on a semiconductor wafer to be performed, a high frequency bias unit which applies a high frequency bias for sputtering to the semiconductor wafer, and a high frequency bias control unit which on/off-controls the high frequency bias. The plasma CVD apparatus also comprises a gas supply unit which supplies gas containing at least hydrogen to the reaction container, and a gas supply control unit which on/off-controls supply of the gas based on an opposite control logic to a control logic of the high frequency bias control unit.

Other objects and features of this invention will become apparent from the following description with reference to the accompanying drawings.

DETAILED DESCRIPTION

An embodiment of the plasma CVD apparatus according to the present invention will be explained hereinafter in detail with reference to the drawings.

Figure 1:
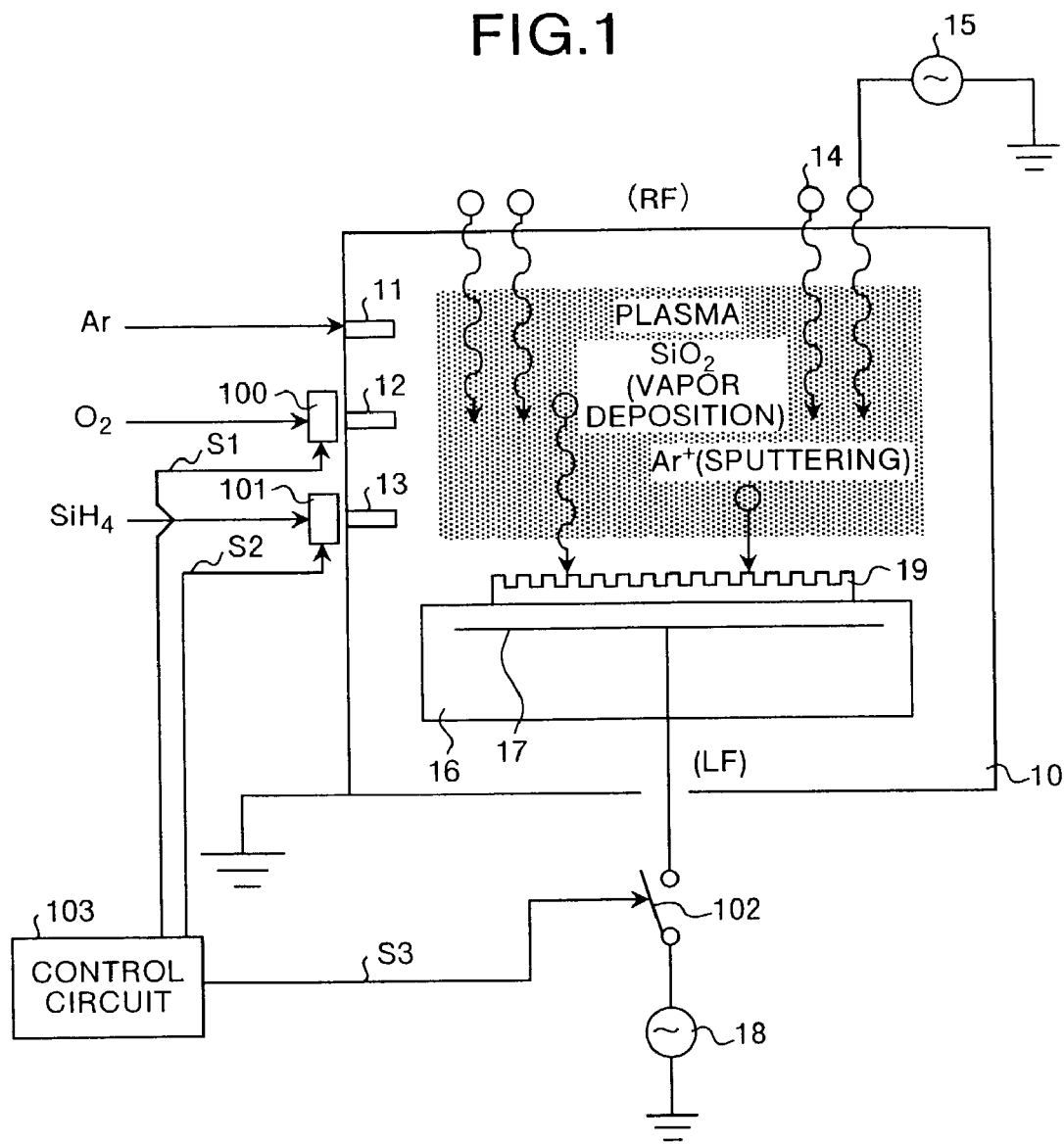
FIG. 1 is a view which shows the configuration of one embodiment of the invention according to the present invention.
Figure 4:
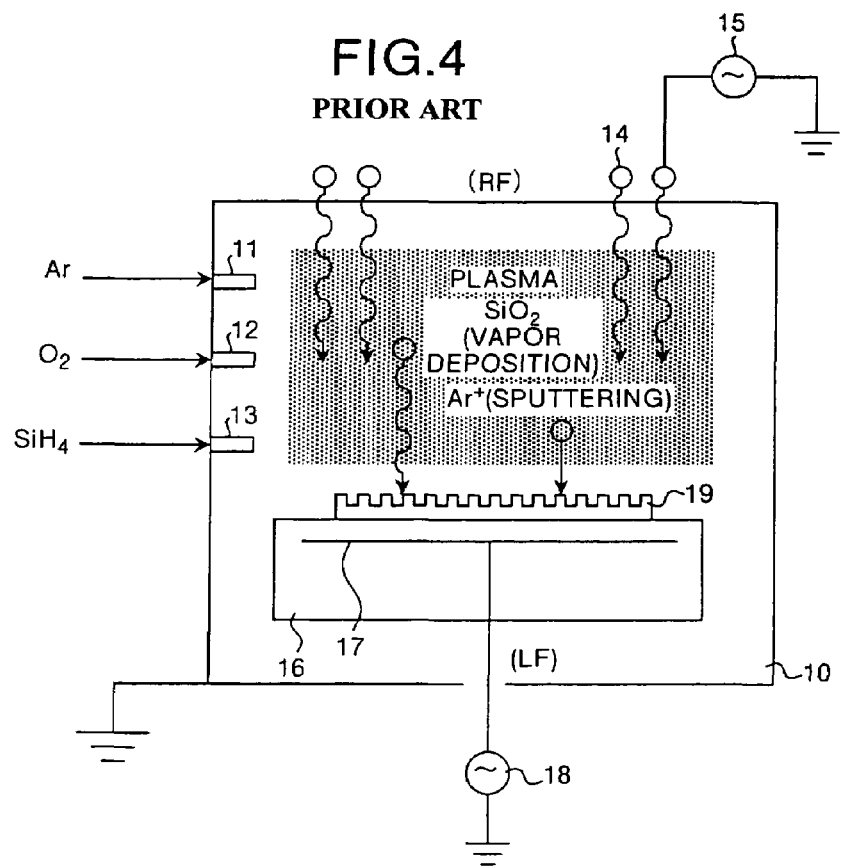
FIG. 4 is a view which shows the configuration of a conventional plasma CVD apparatus.
Figure 5A:
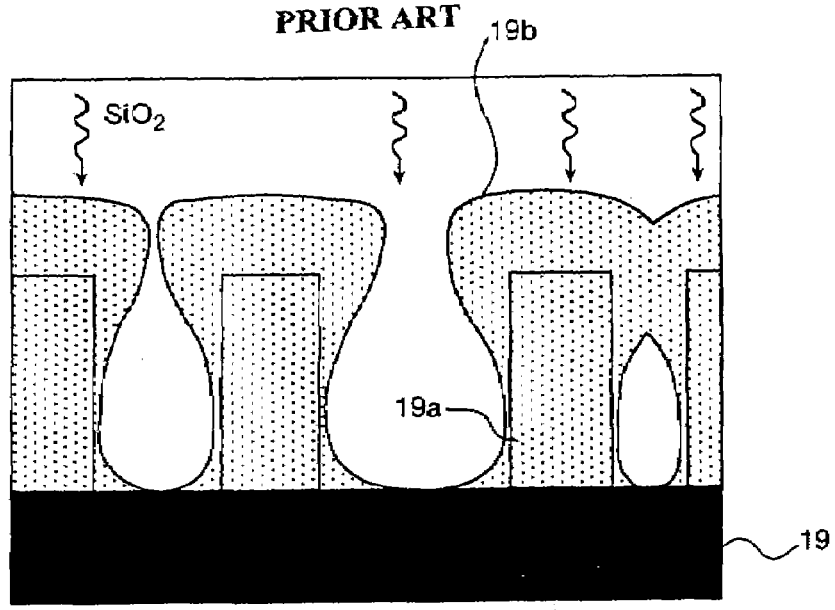
FIG. 5A and FIG. 5B are views which explain film formation in the conventional plasma CVD apparatus.
Figure 5B:
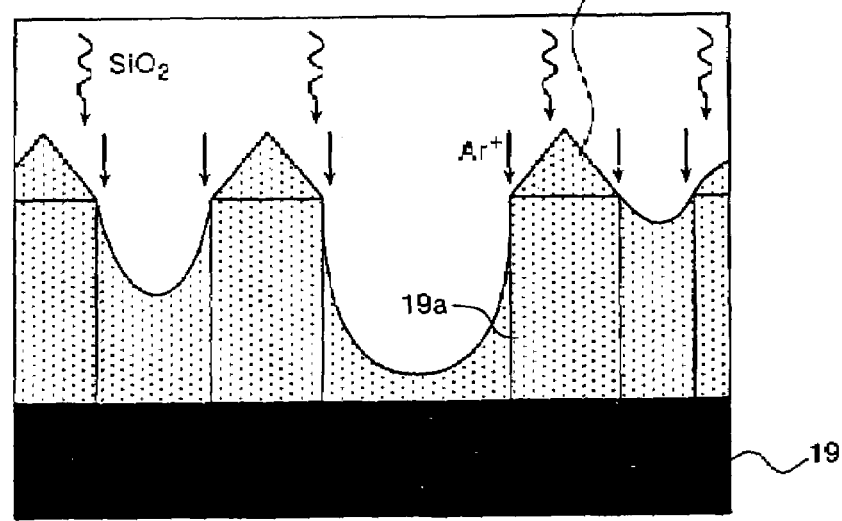
Figure 6:
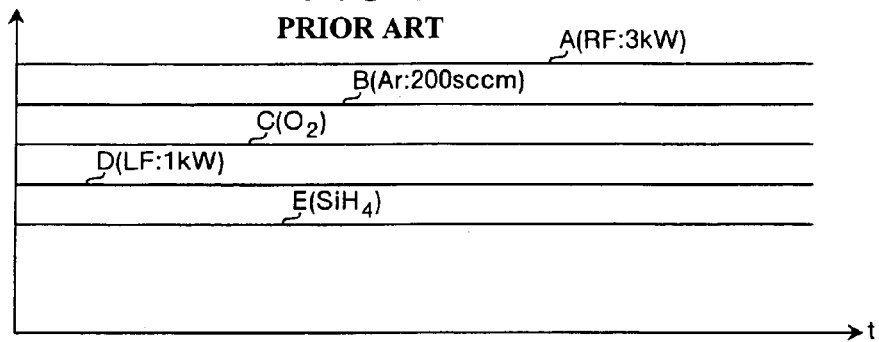
FIG. 6 is a timing chart which explains various gas outputs, an RF input, and an LF input in the conventional plasma CVD apparatus.
Figure 7A:
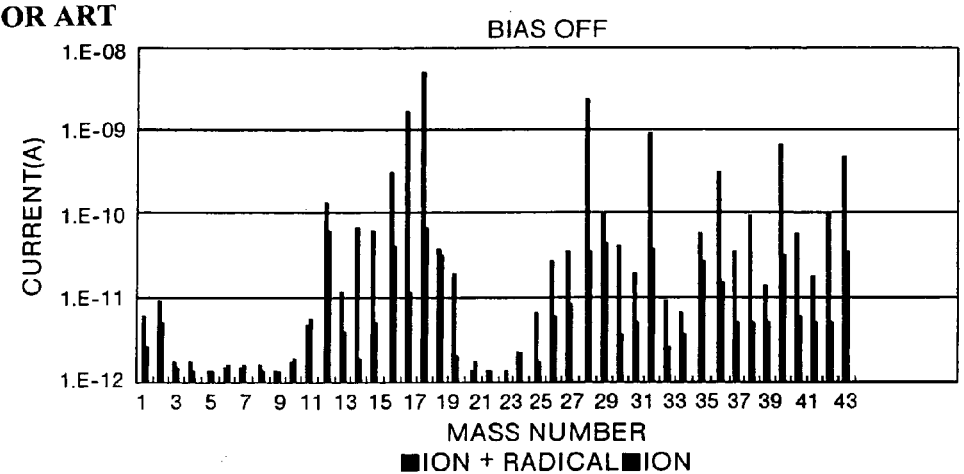
FIG. 7A and FIG. 7B are views which explain the problems of the conventional plasma CVD apparatus.
Figure 7B:
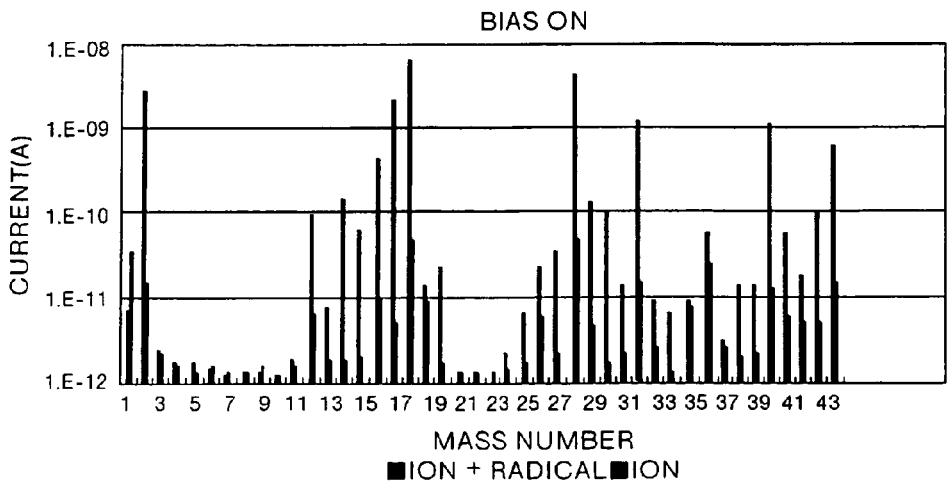
Figure 8:
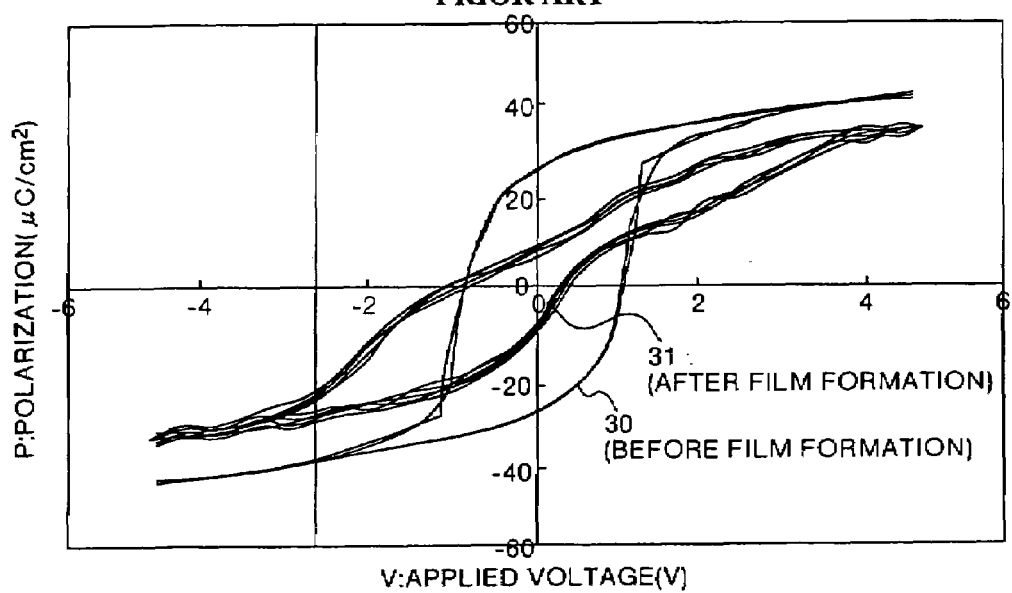
FIG. 8 is a view which shows the P-V characteristic of the conventional plasma CVD apparatus.

FIG. 1 shows the configuration of one embodiment of the apparatus according to the present invention. In FIG. 1, sections corresponding to those shown in FIG. 4 are denoted by the same reference symbols, respectively. In FIG. 1, a flow rate controller 100, a flow rate controller 101, a switch 102 and a control circuit 103 are newly provided.

The flow rate controller 100 turns on and off the flow rate of $O_2$ gas emitted from a nozzle 12 based on an $O_2$ gas flow rate control signal S1 (see FIG. 2B) reversed from the control circuit 103. The $O_2$ gas flow rate control signal S1 shown in FIG. 2B is a signal which is repeatedly turned on and off at predetermined time intervals.

The flow rate controller 101 turns on and off the flow rate of $SiH_4$ gas emitted from a nozzle 13 based on an $SiH_4$ gas flow rate control signal S2 (see FIG. 2C) output from the control circuit 103. The $SiH_4$ gas flow rate control signal S2 shown in FIG. 2C is a signal which is synchronized with the $O_2$ gas flow rate control signal S1 and which is repeatedly turned on and off at predetermined time intervals.

The switch 102 is interposed between the bias electrode 17 and the high frequency power supply 18, and is controlled to be turned on and off based on a bias control signal S3 (see FIG. 2D) output from the control circuit 103. The bias control signal S3 shown in FIG. 2D is a signal which has a reversed relationship with respect to the $O_2$ gas flow rate control signal S1 (see FIG. 2B) and the $SiH_4$ gas flow rate control signal S2 (see FIG. 2C). The control circuit 103 outputs the $O_2$ gas flow rate control signal S1, the $SiH_4$ gas flow rate control signal S2, and the bias control signal S3 to thereby conduct flow rate control and bias control.

Figure 2A:
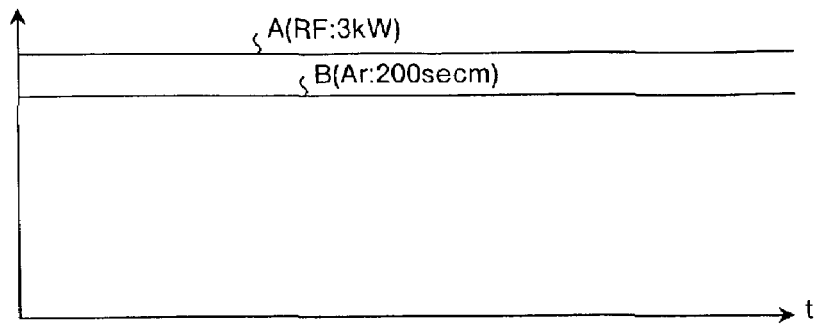
FIG. 2A to FIG. 2D are timing charts which explain various gas outputs, an RF input and an LF input in the embodiment of the invention.
Figure 2B:
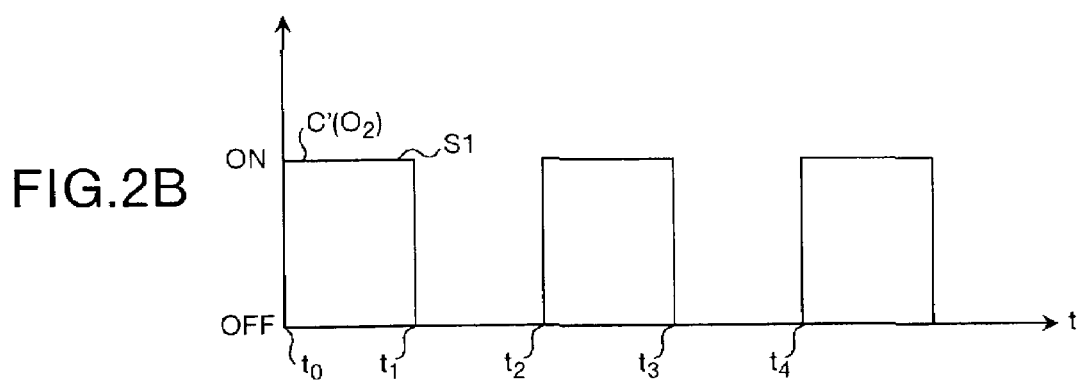

As the line "B" in FIG. 2A indicates that Ar gas is constantly emitted from the nozzle 11 into the reaction container 10. Similarly, the line "A" in FIG. 2A indicates that the high frequency power supply 15 is constantly connected to the RF electrode 14.

Figure 2C:
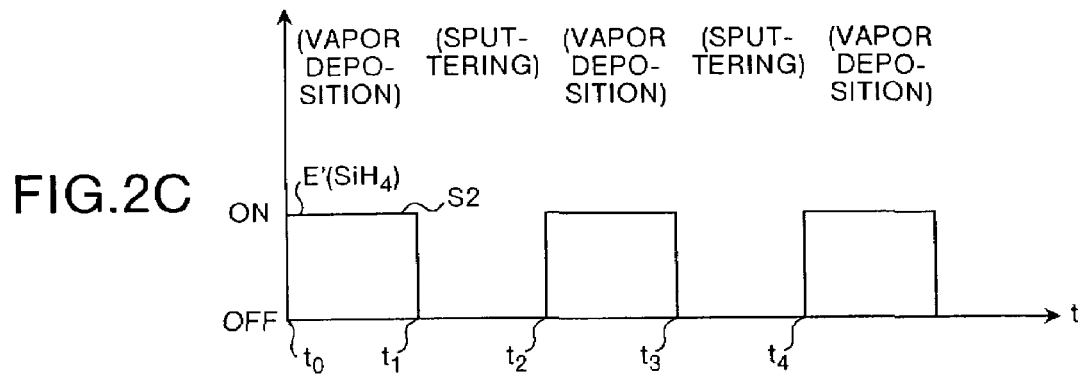
Figure 2D:
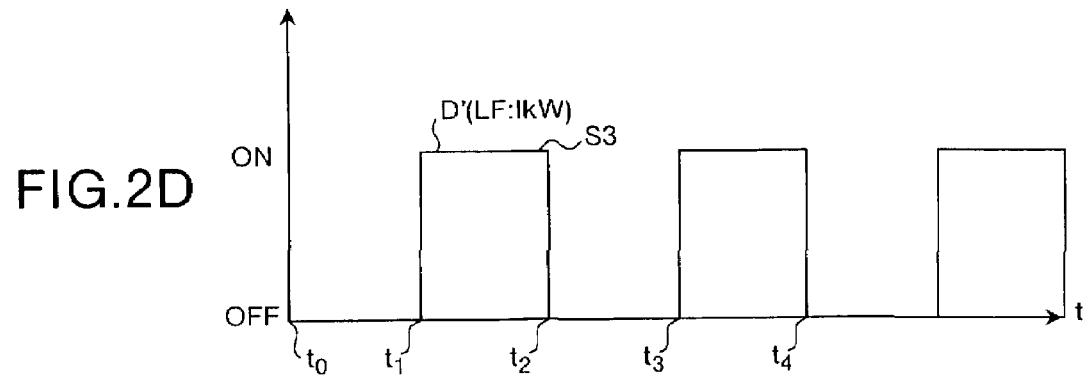

Between time $t_0$ and time $t_1$ (e.g., for 20 sec) shown in FIG. 2B to FIG. 2C, the $O_2$ gas flow rate control signal S1 and the $SiH_4$ gas flow rate control signal S2 are set ON. In this instance, therefore, the $O_2$ gas and the $SiH_4$ gas are emitted from the nozzles 12 and 13 into the reaction container 10, respectively. As a result, an insulating film which consists of $SiH_4$ is evaporated on the surface of the semiconductor wafer 19.

On the other hand, between time $t_0$ and time $t_1$ shown in FIG. 2D, the bias control signal S3 is set OFF. In this instance, since the bias from the bias electrode 17 is set OFF, sputtering is not carried out.

Between time $t_1$ and time $t_2$, the $O_2$ gas flow rate control signal S1 and the $SiH_4$ gas flow rate control signal S2 are changed from ON to OFF. Therefore, the emission of $O_2$ gas and $SiH_4$ gas from the nozzles 12 and 13 is stopped. In this instance, therefore, no insulating film is evaporated on the semiconductor wafer 19.

On the other hand, between time $t_1$, and time $t_2$, the bias control signal S3 is changed from OFF to ON. In this instance, therefore, the bias from the bias electrode 17 is set ON and $Ar^+$ is drawn into the semiconductor wafer 19, i.e., sputtering is carried out. In this instance, $SiH_4$ and the like including hydrogen are not supplied to the reaction container 10, which suppresses unnecessary hydrogen from being drawn into the semiconductor wafer 19. Thereafter, the vapor deposition and the sputtering are alternately repeated at predetermined time intervals.

Figure 3:
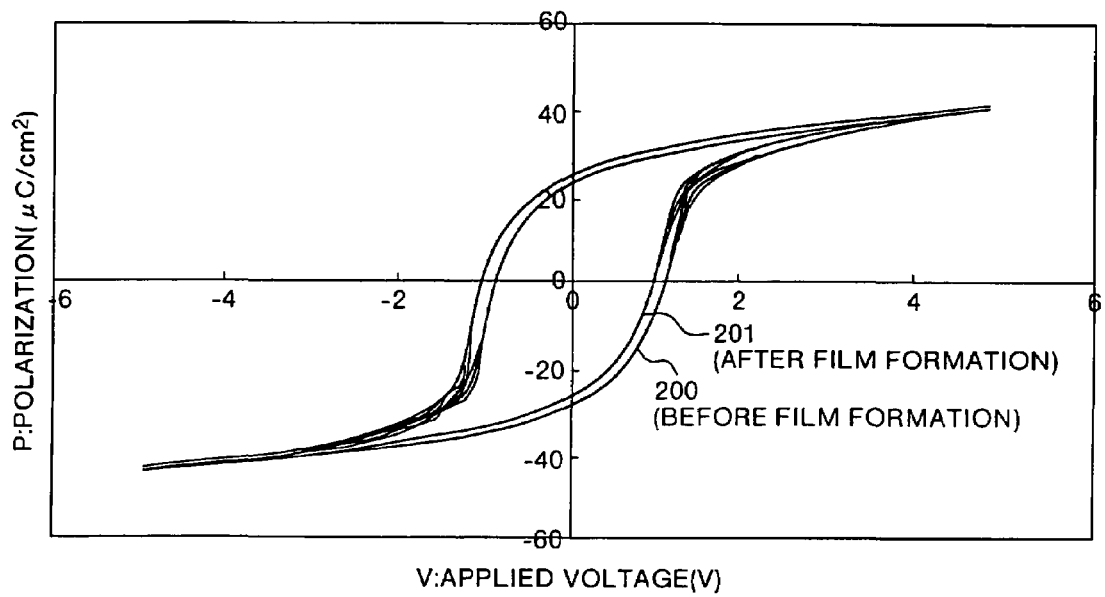
FIG. 3 is a view which shows P-V characteristic in the embodiment of the invention.

FIG. 3 shows the P-V characteristic of the semiconductor wafer 19 in one embodiment of the invention. As can be seen from FIG. 3, before and after film formation, an ordered before-film-formation hysteresis loop 200 and an ordered after-film-formation hysteresis loop 201 are formed, respectively. This represents that the quantity of hydrogen drawn into the semiconductor wafer 19 rapidly decreases in one embodiment of the invention.

According to one embodiment of the invention, sputtering using the bias is carried out while the supply of $SiH_4$ gas including hydrogen is stopped. Therefore, rate of drawing originally unnecessary hydrogen into the semiconductor wafer 19 sharply decreases, making it possible to suppress the deterioration of hydrogen reduction in the semiconductor wafer 19 during the film formation.

Note that it is possible that the control circuit 103 adjusts the switching cycle and the duty ratio between the $O_2$ gas flow rate control signal S1, the $SiH_4$ gas flow rate control signal S2, and the bias control signal S3. In this instance, it is possible to minutely control vapor deposition time and sputtering time in accordance with the state of the semiconductor wafer. Further, in one embodiment of the invention, the instance in which the emission of $O_2$ gas is on/off controlled has been explained. However, since hydrogen is not contained in the $O_2$ gas in its ideal form, the $O_2$ gas may be continuously emitted.

According to the present invention, sputtering using the high frequency bias is carried out while the supply of gas including hydrogen is stopped. Therefore, the rate of drawing originally unnecessary hydrogen into the semiconductor wafer sharply decreases, making it possible to suppress the deterioration of hydrogen reduction in the semiconductor wafer during the film formation.

Moreover, the switching cycle and the duty ratio between the high frequency bias control signal and the gas supply control signal are adjusted. It is, therefore, possible to minutely control vapor deposition time and sputtering time in accordance with the state of the semiconductor wafer.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A plasma chemical vapor deposition apparatus comprising:
    a material gas supply configured to supply a material gas for a vapor deposition process to the plasma chemical vapor deposition apparatus;
    a sputtering gas supply configured to supply a sputtering gas to the plasma chemical vapor deposition apparatus;
    a bias power supply connected to a bias electrode; and a control circuit configured to supply a first control signal for controlling the material gas supply to on/off control the material gas supply during the vapor deposition process in the plasma chemical vapor deposition apparatus, and to on/off control the bias for a sputtering process by a second control signal for controlling the bias power supply which is different from the first control signal, wherein said control circuit is configured to control said first and second control signals during first predetermined intervals such that the first control signal for the material gas supply is off while the second control signal for the bias is on;

said control circuit is configured to control said first and second control signals during second predetermined intervals such that the first control signal for the material gas supply is on while the second control signal for the bias is off; and said control circuit is configured to control the first and second control signals such that the first and second predetermined intervals are alternately repeated throughout the entire vapor deposition and sputtering process conducted by the plasma chemical vapor deposition apparatus such that sputtering is performed while the material gas supply of the material gas containing at least hydrogen is stopped and sputtering is not performed while the material gas supply is on, and wherein the control circuit is configured to supply the sputtering gas continuously throughout the entire vapor deposition and sputtering process.

2. The apparatus according to claim 1, wherein the control circuit and the bias power supply are configured such that a switching cycle and a duty ratio between the first control signal and the second control signal is adjustable.

3. The apparatus according to claim 1, wherein the material gas comprises $SiH_4$ and $O_2$.

4. The apparatus according to claim 1, wherein the sputtering gas comprises Ar.

* * * * *